United States Patent
Carney et al.

Patent Number: 5,480,835
Date of Patent: Jan. 2, 1996

[54] ELECTRICAL INTERCONNECT AND METHOD FOR FORMING THE SAME

[75] Inventors: Francis J. Carney, Gilbert; George F. Carney; Douglas G. Mitchell, both of Tempe, all of Ariz.

[73] Assignee: Motorola, Inc., Schaumburg, Ill.

[21] Appl. No.: 350,395

[22] Filed: Dec. 5, 1994

Related U.S. Application Data

[63] Continuation of Ser. No. 57,398, May 6, 1993, abandoned.

[51] Int. Cl.$^6$ .................................................. H01L 21/44
[52] U.S. Cl. ...................... 437/189; 437/192; 437/194; 437/209; 205/125; 205/83; 205/170; 205/224; 205/226; 257/779; 228/180.22; 427/58; 427/123; 427/125; 427/376.6; 427/250
[58] Field of Search ................................. 205/122, 125, 205/83, 170, 224, 226; 257/779; 228/180.22; 437/192, 194, 189, 209, 190; 427/58, 123, 125, 376.6, 250

[56] References Cited

U.S. PATENT DOCUMENTS

| | | | |
|---|---|---|---|
| 5,071,518 | 12/1991 | Pan | 205/122 |
| 5,075,965 | 12/1991 | Carey et al. | 29/840 |
| 5,130,779 | 7/1992 | Agarwala et al. | 357/67 |
| 5,194,137 | 3/1993 | Moore et al. | 205/125 |
| 5,221,038 | 6/1993 | Melton et al. | 228/180.22 |
| 5,230,965 | 7/1993 | Cole, Jr. et al. | 205/125 |
| 5,352,629 | 10/1994 | Paik et al. | 437/189 |

*Primary Examiner*—Kathryn Gorgos
*Attorney, Agent, or Firm*—Gary W. Hoshizaki

[57] ABSTRACT

A method for forming an electrical interconnect on a substrate. At least one pad (14) is formed on a substrate (11). The pad (14) is formed having a non-wetting surface (12) and a wettable surface (13). Photoresist (44) is patterned on a substrate (41) forming a cavity on a pad (46) leaving a non-wetting surface (42) and a wettable surface (43) exposed. Interconnect material (56) is formed on a non-wetting surface (52) and a wettable surface (53) of pad 57. Interconnect material (56) is reflowed forming an interconnect ball (74) on a wettable surface (73). Surface tension causes interconnect material (56) when reflowed to flow from a non-wetting surface (72) to the wettable surface (73) and ball up to form the interconnect ball (74).

20 Claims, 2 Drawing Sheets

ELECTRICAL INTERCONNECT AND METHOD FOR FORMING THE SAME

This application is a continuation of prior application Ser. No. 08/057,398, filed May 6, 1993, now abandoned.

BACKGROUND OF THE INVENTION

This invention relates, in general, to electrical interconnect, and more particularly to solder ball interconnect.

It is well known by one skilled in the art that solder ball or bump technology is commonly used for electrical and mechanical interconnection of an integrated circuit to a substrate. In general, solder balls are formed on pads of either the integrated circuit, the substrate, or both. The integrated circuit and substrate are aligned and mated together, the assembly is then heated to reflow the solder balls coupling and electrically connecting the integrated circuit to the substrate. The initial formation of a solder ball on a contact pad is critical. Issues such as solder ball uniformity, conductive quality, bond strength, and ball height are critical to producing reliable interconnection. Increasing solder ball height while decreasing pad pitch (for more interconnect) is extremely difficult for many solder ball manufacturing methods. Solder balls are generally formed of lead and tin. High concentrations of lead are sometimes used to make the bump more compatible to subsequent processing steps. Tin is added to strengthen bonding (to such metals as copper) and serves as an anti-oxidant.

One method well known in the industry for forming solder balls is using a metal plating process. Pad areas are isolated by photoresist and metal is deposited, the composition of which forms solder when reflowed. The photoresist height surrounding the pad area limits the amount of metal being deposited. The well or via formed by the photoresist on the pad area is filled with metal. The photoresist is then removed and the metal on the pad areas is reflowed forming a solder ball. Solder balls are formed having a height ranging from 50 to 150 microns. Two problems areas exist for this method when the height of the bump is increased and the pad pitch is decreased. First, it is difficult to form photoresist accurately when applied very thick. Multiple steps can be used to "build" the photoresist up at the expense of increased manufacturing steps. Second, as the well or via height increases, great care must be taken to insure that metal is distributed evenly throughout the wafer so that the solder balls are formed having a uniform height.

A second method well known in the industry for forming solder balls is using a metal evaporative process. Pad areas are isolated by the use of a mask, often made of metal, the various metals are deposited through the vias formed in the mask by condensation of the evaporated metals on the substrate. The final composition and shape of the solder balls is usually achieved after the metal is reflowed. The size and height of the solder balls is determined by the vias formed in the mask and the thickness of the mask. The major problem with this methodology is the high cost for the evaporators and the possible high cost for the metal masks. Another problem can be the temperature rise of the mask and substrate caused by the condensation of the evaporated metal on the substrate and mask. Since the substrate and mask are usually made of different materials, their coefficient of thermal expansion is also different. The coefficient of thermal expansion mismatch causes problems with alignment of the via to pad on large substrates at elevated temperatures. The mask must also be cleaned after each deposition, because in an evaporator, the metal is equally distributed over the entire surface of the mask and via.

A third solder ball method used in the industry is preformed solder ball placement and reflow technique. Preformed solder balls are manufactured of a uniform size. The solder balls are then placed on the pad areas of an integrated circuit or substrate. The equipment to perform this task is complex and expensive. Once aligned to the pad areas, the preformed solder balls are reflowed to connect to the pad area. This technique is not good for tight pad pitches and small solder balls.

It would be of great benefit if a method for making interconnect could be developed which simplified manufacturing, yet formed interconnect of increased height and density.

SUMMARY OF THE INVENTION

Briefly stated, this invention provides an electrical interconnect and a method for forming the same. A plurality of pads are formed on a substrate for electrical interconnect external to the substrate. Each pad has a surface that comprises a portion having a non-wetting surface and a portion having a wettable surface.

DETAILED DESCRIPTION OF THE DRAWINGS

Figure 1:
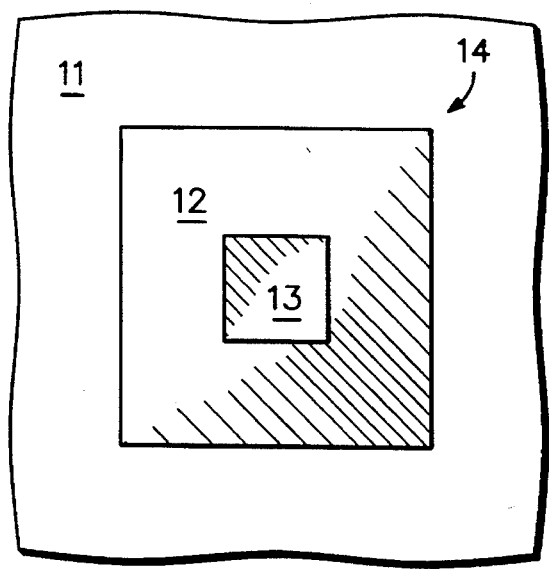
FIG. 1 is a top view illustrating metalization of a pad having a wettable surface and a non-wettable surface in accordance with the present invention.

FIG. 1 is an illustration of a pad 14 having a wettable surface 13 and a non-wetting surface 12 in accordance with the present invention.

A pad is an interconnect area formed on a substrate or integrated circuit. Pads formed on a substrate or integrated circuit provide electrical coupling points to other areas external to the substrate. For example, wire bonding from pads on an integrated circuit to a semiconductor package. It should be obvious to one skilled in the art that pads are typically coupled to electronic circuitry on the substrate or integrated circuit.

A pad interconnect technique well known in the industry that provides for increased pad density is the use of solder balls. Solder balls are placed on pads of a first substrate for electrically and mechanically coupling to corresponding pads of a second substrate. The pads on the first and second substrate align to one another. The substrates are mated together such that the solder balls on the first substrate come in contact with the pads on the second substrate. Heating the solder balls causes the solder to melt coupling the pads of the first substrate to the pads of the second substrate. As pad pitches are reduced it becomes increasingly difficult to form tall and uniform solder balls on pads of increased density and reduced size. For example, it would be difficult to form a 125 micron tall solder ball on 0.075 millimeter square pads having a 0.2 millimeter pad pitch using standard plating techniques. A method for forming an interconnect on a pad area that reduces cost, simplifies manufacturing, increases interconnect height, and provides uniform interconnect is provided by this invention.

A concept that is key to this invention resides in the interaction of specific interconnect materials to a non-wetting surface and a wettable surface. An interconnect material, for example, solder has well known adhesive qualities suitable for mechanical coupling to a pad. Solder is also electrically conductive. Solder is an alloy commonly formed from a combination of tin-lead, many other solder alloys exist such as tin-bismuth, indium-tin, tin-lead-silver, and tin-gold to name only a few. Although solder is the preferred embodiment of the interconnect material, any electrically conductive material having similar properties as described herein will suffice as an alternate to solder.

A non-wetting surface can be formed from "non-wetting" materials such as aluminum, chromium, titanium-tungsten, nickel, titanium-tungsten-nitride, titanium, etc.. Materials having non-wetting characteristics are well known in the art. The surface of these materials can be made to oxidize easily. The oxide layer on the surface of the material prevents wetting and does not form a strong adhesive connection with the interconnect material (such as solder). In very simple terms, the interconnect material does not adhere strongly to the material having a non-wetting surface. The oxide layer described above is not meant to imply that oxidation is the only means for forming a non-wetting surface other materials exist that are non-wetting due to other physical parameters. It is possible for the non-wetting materials described above to be formed or deposited without forming a non-wetting surface, it should be obvious that an extra oxidation step is necessary to form the non-wetting surface. Illustrated in FIG. 1 is a portion of a substrate 11 having pad 14. Pad 14 is formed having non-wetting surface 12. It should be noted that FIGS. 1–8 show a single pad on a substrate but that hundreds or thousands of pads could be formed simultaneously using the invention described herein.

A wetting surface can be formed from "wettable" materials such as copper, silver, and gold to name only a few. Materials having wetting properties are well known in the art. The wettable surface of these materials will form a strong adhesive connection with the metallurgy of the interconnect material (such as solder). Simply described, the interconnect material will strongly adhere to the material providing a wettable surface. It is possible for the wetting materials described above to be formed or deposited with a "non-wetting" surface, it should be obvious to one skilled in the art that an extra cleaning step is necessary under these conditions to prepare the surface to be a "wetting surface". Pad 14 is formed having non-wetting surface 12 and wettable surface 13. In the preferred embodiment, wettable surface 13 is centrally located in pad 14. Wettable surface 13 can be placed anywhere within pad 14. The ratio of wettable surface 13 and non-wetting surface 12 in pad 14 is an important parameter that will be described hereafter. As mentioned previously, pad 14 is an interconnect point for substrate 11. Interconnection on substrate 11 to pad 14 is not illustrated but should be obvious to one skilled in the art.

Figure 2:
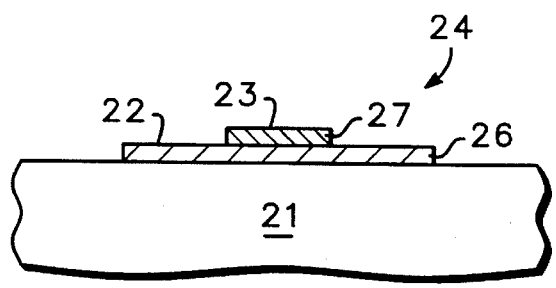
FIG. 2 is a cross-sectional view of a pad similar to that of FIG. 1.

FIG. 2 is a cross-sectional view of an embodiment of a pad 24 having a wettable surface 23 and a non-wetting surface 22 in accordance with the present invention.

A portion of a substrate 21 is illustrated in FIG. 2. Pad 24 is formed using standard process techniques for patterning and forming metal on a substrate material. A non-wetting layer 26 of a material such as aluminum, chromium, titanium-tungsten, nickel, titanium-tungsten-nitride, titanium, etc. is formed or deposited on substrate 21. In the preferred embodiment, metal is sputtered to form non-wetting layer 26. A wettable layer 27 of a material such as copper, gold, or silver is formed or deposited on a portion of non-wetting layer 26. In the preferred embodiment, metal is sputtered to form wettable layer 27. It is essential that wettable layer 27 and non-wetting layer 26 make a low resistance electrical connection since pad 24 is an electrical contact point.

Sputtering metal is only one method of forming wettable layer 27 and non-wetting layer 26. Many other methods (evaporation techniques, electroplating, auto catalytic processes etc.) that are well known in the semiconductor arts can be used in its place. Pad 24 is formed having two distinct surfaces. A non-wetting surface 22 and a wettable surface 23.

Figure 3:
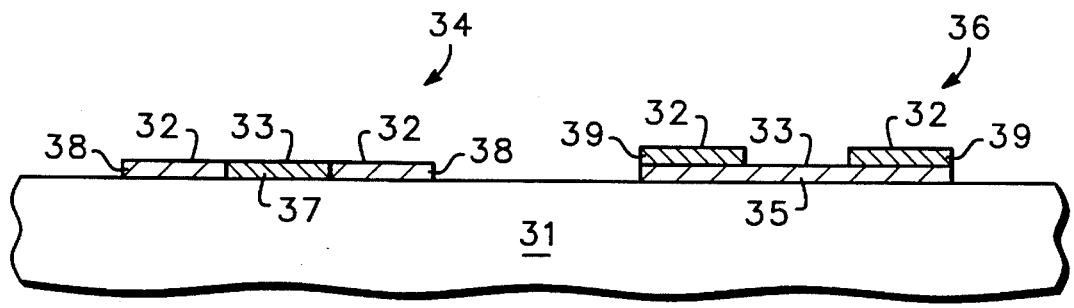
FIG. 3 is a cross-sectional view of two different embodiments of a pad having a wettable and a non-wettable surface in accordance with the present invention.

FIG. 3 is a cross-sectional view of two alternate embodiments of a pad 34 and a pad 36 having wettable surfaces 33 and non-wetting surfaces 32 in accordance with the present invention.

Pad 34 and pad 36 are formed using well known patterning and material deposition techniques of the semiconductor arts similar to that described above. Pad 34 is formed having wettable surface 33 and non-wetting surface 32 planar to one another. Non-wetting material 38 should make a low resistance electrical contact to wettable material 37.

Pad 36 is formed oppositely from pad 24 described in FIG. 2. Wettable material 35 is formed or deposited on substrate 31 first. Non-wetting material 39 is then formed or deposited on a portion of wettable material 35 such that a portion of wettable surface 33 is exposed. Wettable material 35 should make a low resistance electrical contact to non-wetting material 39.

Figure 4:
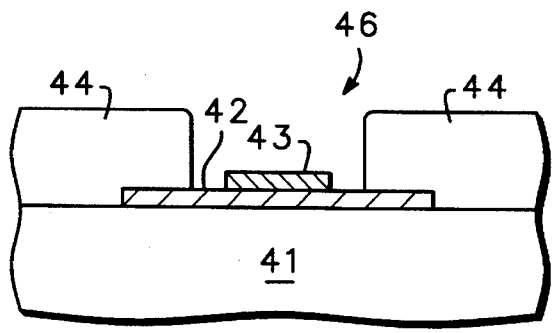
FIG. 4 is a cross-sectional view of a pad masked by photoresist in accordance with the present invention.

FIG. 4 is a cross-sectional view of a pad 46 masked by photoresist in accordance the present invention.

Pad 46 is formed similar to pad 24 of FIG. 2. A layer of photoresist 44 is patterned and formed on a substrate 41 and pad 46 leaving an exposed wettable surface 43 and an exposed non-wetting surface 42. Photoresist 44 forms a cavity or via on pad 46 in which interconnect material can be deposited or formed.

Figure 5:
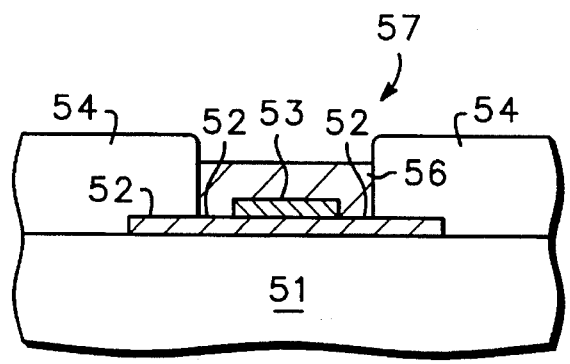
FIG. 5 is a cross-sectional view of a pad having electrically conductive interconnect material formed on a wettable and non-wettable surface of the pad in accordance with the present invention.

FIG. 5 is a cross-sectional view of a pad 57 formed on substrate 51 in accordance with the present invention.

Pad 57 is patterned by a layer of photoresist 54 similar to that described in FIG. 4. Interconnect material 56 is formed or deposited on both non-wetting surface 52 and wettable surface 53 of pad 57. In the preferred embodiment, a layer of photoresist 54 is formed having a thickness greater than the thickness of interconnect material 56 to be formed on pad 57. In the preferred embodiment, interconnect material 56 is solder. The solder is formed within the cavity created by photoresist 54 on pad 57.

In the preferred embodiment, interconnect material 56 is formed on pad 57 using an electroplating process. Although not illustrated, it is well known in the plating arts that pad 57 must be coupled to a voltage potential. An electroplating process is inexpensive and provides tight control over the total volume of interconnect material placed on pad 57. For example, a solder to be formed comprises 98 percent tin and 2 percent lead, a layer of tin is electroplated on pad 57 and then a layer of lead is electroplated on the layer of tin. The amount of tin and lead formed in the cavity is controlled during the electroplating process to meet the 98 percent tin and 2 percent lead content of the solder. At this point, solder is not yet formed since the tin and lead have not been combined together. Other methods can be used such as material evaporation or an auto catalytic process (electroless plating) to form interconnect material 56 on pad 57.

This invention provides a significant advantage in that the height of a solder ball formed on pad 57 is not directly determined by the thickness of photoresist 54. For example, forming a tall solder ball in the range of 125 microns to 150 microns could be accomplished by forming photoresist 54 to a thickness in excess of 150 microns and filling the cavity or via with solder to the height required of the solder ball. Problems in process and manufacturing prevent this from being easily achieved. First, it is difficult to form photoresist accurately to these thicknesses using wet photoresist techniques. Multiple layers of photoresist could be built up to increase thickness, but at the expense of added processing steps and increased variability. Dry film photoresist formed to these thicknesses is expensive and is prone to substrate breakage. Dry film photoresist can lose adhesion to the substrate during a plating process causing underplating which leads to possible shorting failures. Second, device geometries are constantly being reduced to increase circuit density on a single semiconductor chip, higher functionality almost always implies increased pad counts. The increase in pad counts can be accommodated by reducing pad pitch. Small pad pitches compounds the problem of forming thick photoresist thereby decreasing yields further. Finally, forming interconnect material having correct composition (stoichiometry) such as a tin-lead solder in a deep cavity or via using an electroplating process or an auto catalytic process is difficult to achieve as is well known in the plating arts.

In the preferred embodiment, photoresist 54 is formed to a thickness of approximately 50 microns or less. Photoresist can be formed uniformly throughout the substrate at this thickness with relative ease. The plating stoichiometry and the amount of plated material can also be controlled accurately at this photoresist thickness. It is also possible to plate above photoresist 54 as is well known in the arts (mushroom bumps) but this makes controlling the stoichiometry difficult and is not applicable for fine pad pitches. As mentioned previously, the height of the solder ball to be formed is not a function of the photoresist thickness. The solder ball height is determined by the volume of material placed on pad 57 comprising both non-wetting surface 52 and wettable surface 53. Another factor which plays a key role is the ratio of non-wetting surface 52 to wettable surface 53.

Figure 6:
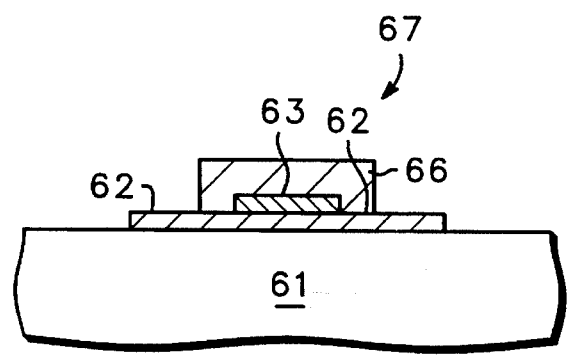
FIG. 6 is a cross-sectional view of a pad having electrically conductive interconnect material formed thereon in accordance with the present invention.

FIG. 6 is a cross-sectional view of a pad 67 having an electrically conductive interconnect material 66 formed thereon in accordance with the present invention. FIG. 6 is similar to FIG. 5 except that patterning photoresist 54 is removed. In the preferred embodiment, interconnect material 66 is solder. Interconnect material 66 contacts both non-wetting surface 62 and wettable surface 63.

Figure 7:
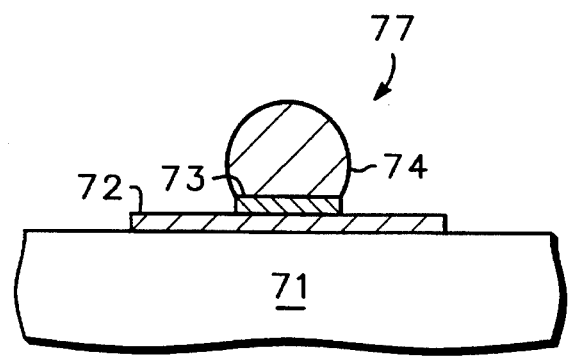
FIG. 7 is a cross-sectional view of an electrically conductive interconnect ball after reflow in accordance with the present invention.

FIG. 7 is a cross-sectional view of an electrically conductive interconnect ball 74 after reflow in accordance with the present invention.

Reflowing interconnect material 66 as shown in FIG. 6 changes interconnect material 66 formed on both non-wetting surface 62 and wettable surface 63 to an interconnect ball 74 as illustrated in FIG. 7. In the preferred embodiment, interconnect ball 74 comprises solder. For example, assume a layer of tin was formed on pad 77 and a layer of lead was formed on the layer of tin. The tin-lead ratio is 98 percent tin to 2 percent lead as previously described. Reflow of these materials consists of heating the tin-lead until it liquefies and flows. The tin-lead mix together during reflow to form solder. Note how the interconnect ball resides only on a wettable surface 73 of a pad 77. Interconnect material such as solder has high surface tension. Heating solder to a liquid state allows the solder to flow. Interconnect material that was originally formed on non-wetting surface 72 "de-wets" during reflow and adheres only to wettable surface 73. The surface tension of the solder causes the solder to "ball up" forming an interconnect ball 74 on wettable surface 73. The height of interconnect ball 74 is a function of the area of wettable surface 73 and the total volume of interconnect material. The surface tension of solder is such that solder balls having heights in excess of 100 microns can be formed using this technique. The ratio of non-wetting surface to wettable surface as well as the area of wettable surface 73 is a function of the interconnect material used and the height needed. By either increasing the total volume of interconnect material or reducing the area of wettable surface 73, or a combination of both, the height of interconnect ball 74 can be increased (within limits of the interconnect material).

Figure 8:
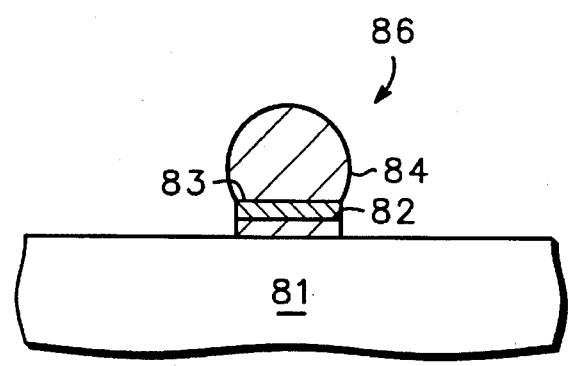
FIG. 8 is a cross-sectional view of a pad and interconnect ball in accordance with the present invention.

FIG. 8 is a cross-sectional view of a substrate 81 having a pad 86 with an interconnect ball 84 formed thereon in accordance with the present invention. Non-wetting surface 72 extends past wettable surface 73 to increase total area of pad 77 of FIG. 7. It is sometimes desirable to remove non-wetting surface 72 from pad 77 as illustrated in FIG. 8. A non-wetting material 82 is removed until it is flush with a wettable material 83. The removal of non-wetting material 82 is accomplished using standard techniques common to semiconductor processing and does not affect interconnect ball 84 or wettable material 83.

By now it should be appreciated that a method for forming an electrical interconnect has been provided. The method allows an interconnect ball of an increased height to be formed on a pad using standard processing techniques. The method is compatible for use in forming a tall interconnect ball as pad pitch is reduced.

We claim:

1. A method for forming a pad of an integrated circuit, the method comprising:

forming a pad having an exposed surface, a first portion of said exposed surface being a wettable surface and a second portion being a non-wetting surface, said wettable surface and non-wetting surface are electrically conductive;

forming a layer of interconnect material on said wettable surface and said non-wetting surface wherein said non-wetting surface increases an area of said exposed surface that allows a thinner layer of interconnect material to be placed on said pad for a given volume of interconnect material.

2. A method as recited in claim 1 including;

depositing a non-wetting material on the substrate to form said non-wetting surface of each pad; and depositing a wettable material on a portion of said non-wetting surface of each pad to form said wettable surface of each pad.

3. A method as recited in claim 1 including;

depositing a non-wetting material on the substrate to form a portion of each pad; and depositing a wettable material on the substrate adjacent to said non-wetting material on the substrate to form a remaining portion of each pad, wherein said non-wetting and wettable materials respectively form said non-wetting and wettable surfaces on each pad.

4. A method as recited in claim 1 wherein said forming each pad step includes depositing a wettable material on the substrate to form said wettable surface of each pad; and depositing a non-wetting material on a portion of said wettable material of each pad to form said non-wetting surface of each pad.

5. A method as recited in claim 1 further including patterning photoresist on the substrate on areas other than each pad leaving exposed said wettable surface and non-wetting surface of each pad.

6. A method as recited in claim 5 further including electroplating an interconnect material on said wettable surface and said non-wetting surface of each pad reflowing said interconnect material, said interconnect material flows from said non-wetting surface to said wettable surface of each pad and balls up due to surface tension of said interconnect material.

7. A method as recited in claim 6 wherein said electroplating an interconnect material step includes electroplating a layer of tin; and electroplating a layer of lead.

8. A method as recited in claim 7 wherein said reflowing said interconnect material step includes heating said layers of tin and lead of each pad until liquefied to form solder whereby surface tension causes said solder to flow from said non-wetting surface to said wettable surface of each pad and to ball up.

9. A method as recited in claim 5 further including electroless plating an interconnect material on said wettable surface and said non-wetting surface of each pad reflowing said interconnect material, said interconnect material flows from said non-wetting surface to said wettable surface of each pad and balls up due to surface tension of said interconnect material.

10. A method as recited in claim 5 further including evaporating interconnect material on said wettable surface and said non-wetting surface of each pad reflowing said interconnect material, said interconnect material flows from said non-wetting surface to said wettable surface of each pad and balls up due to surface tension of said interconnect material.

11. A method for forming an electrical interconnect of increased height, the method comprising:

forming an electrically conductive pad having an exposed surface, said exposed surface comprising a wettable surface and a non-wetting surface;

forming a layer of electrically conductive interconnect material on said wettable surface and non-wetting surface of said pad;

reflowing said layer of electrically conductive interconnect material to form an interconnect ball on said wettable area wherein said layer of electrically conductive interconnect material on said non-wetting surface flows to said wettable surface for increasing a volume and height of said interconnect ball.

12. A method as recited in claim 11 wherein said forming a plurality of pads step includes depositing non-wetting materials to form said non-wetting surface, said non-wetting material is chosen from a group consisting of aluminum, chromium, titanium-tungsten, nickel, titanium-tungsten-nitride, and titanium; and depositing wettable material to form said wettable surface, said wettable material is chosen from a group consisting of copper, silver, and gold.

13. A method as recited in claim 11 wherein said forming an interconnect material on each pad step includes electroplating said interconnect material on said non-wetting surface and said wettable surface of each pad.

14. A method as recited in claim 11 wherein said forming an interconnect material on each pad step includes electroless plating said interconnect material on said non-wetting surface and said wettable surface of each pad; and reflowing said interconnect material, said interconnect material flows from said non-wetting surface to said wettable surface of each pad and balls up due to surface tension of said interconnect material.

15. A method as recited in claim 11 wherein said forming an interconnect material on each pad step includes evaporating said interconnect material on said non-wetting surface and said wettable surface of each pad;

reflowing said interconnect material, said interconnect material flows from said non-wetting surface to said wettable surface of each pad and balls up due to surface tension of said interconnect material.

16. A method as recited in claim 11 wherein said patterning photoresist on the substrate step includes forming photoresist on the substrate having a thickness less than 50 microns.

17. A method as recited in claim 11 wherein said forming an interconnect material step includes depositing materials on said non-wetting surface and said wettable surface of each pad from a group consisting of tin-lead, tin-bismuth, indium-tin, tin-lead-silver, and tin-gold.

18. A method for forming a solder ball of increased height, the method comprising:

providing a substrate;

forming a plurality of pads, each pad being electrically conductive and having an exposed surface, said exposed surface comprising a non-wetting surface and a wettable surface;

patterning photoresist on said substrate wherein said wettable surface and said non-wettable surface of each pad is exposed;

electroplating a layer of solder on said exposed surface of each pad wherein said non-wetting surface increases an area of each pad to decrease a thickness of said layer of solder; and reflowing said layer of solder on each pad to a liquid state wherein said solder couples to said Wettable surface of each pad and wherein surface tension of said solder causes said solder to flow from said non-wetting surface of each pad forming a solder ball of increased height on said wettable surface of each pad.

19. A method as recited in claim 18 wherein said forming a plurality of pads step includes forming said non-wetting surface of each pad by depositing materials from a group consisting of aluminum, chromium, titanium-tungsten, nickel, titanium-tungsten-nitride, and titanium; and forming said wettable surface of each pad by depositing material from a group consisting of copper, gold, and silver.

20. A method as recited in claim 18 wherein said electroplating interconnect material step includes electroplating materials on each pad from a group consisting of tin-lead, tin-bismuth, indium-tin, tin-lead-silver, and tin-gold.

* * * * *